(12) United States Patent
Chen et al.

(10) Patent No.: US 7,897,431 B2
(45) Date of Patent: Mar. 1, 2011

(54) STACKED SEMICONDUCTOR DEVICE AND METHOD

(75) Inventors: Min-Liang Chen, Hsinchu (TW); Hai-Jun Zhao, Hsinchu (TW)

(73) Assignee: Promos Technologies, Inc., Hsinchu (TW)

( * ) Notice: Subject to any disclaimer, the term of this patent is extended or adjusted under 35 U.S.C. 154(b) by 178 days.

(21) Appl. No.: 12/348,403

(22) Filed: Jan. 5, 2009

(65) Prior Publication Data
US 2010/0038802 A1    Feb. 18, 2010

Related U.S. Application Data

(60) Provisional application No. 61/006,845, filed on Feb. 1, 2008.

(51) Int. Cl.
*H01L 21/44* (2006.01)
*H01L 21/50* (2006.01)
*H01L 23/02* (2006.01)
*H01L 23/48* (2006.01)

(52) U.S. Cl. .................. 438/106; 438/118; 257/686; 257/783

(58) Field of Classification Search .................. None
See application file for complete search history.

(56) References Cited

U.S. PATENT DOCUMENTS

2007/0164431 A1    7/2007 Lee et al.

*Primary Examiner*—Scott B Geyer
(74) *Attorney, Agent, or Firm*—Finnegan, Henderson, Farabow, Garrett & Dunner, LLP

(57) ABSTRACT

A method of stacking wafers includes: providing a first wafer including a first metal connection layer; forming a first passivation layer over the first metal connection layer; forming a first bondpad in the first passivation layer to form a first bondpad layer; providing a second wafer including second metal connection layer; forming a second passivation layer over the second metal connection layer; forming a second bondpad in the second passivation layer to form a second bondpad layer; forming at least one of a first conductive adhesive layer over the first bondpad layer and a second conductive adhesive layer over the second bondpad layer; and stacking the second wafer on the first wafer by bonding respective faces of the second bondpad layer with the first bondpad layer via the at least one of the first conductive adhesive layer and the second conductive adhesive layer.

22 Claims, 9 Drawing Sheets

STACKED SEMICONDUCTOR DEVICE AND METHOD

This application claims the benefit of priority from U.S. Provisional Application No. 61/006,845, filed on Feb. 1, 2008.

TECHNICAL FIELD

Methods and devices disclosed herein relate to the field of integration of semiconductors devices and, more specifically, to stacking multiple semiconductor wafers.

BACKGROUND INFORMATION

As the operating speeds and performance requirements of computers increase, the amount of memory required for computers also increases. Along with a desire to increase memory capacity, consumers also desire computers with reduced size and reduced cost. Consequently, there is an increasing demand for high density, reduced size, and low cost memory devices.

To meet this increasing demand, new technologies with finer design rules have been adopted in order to produce higher density and smaller size memory devices. However, investing in new technologies is labor intensive, expensive, and risky. Further, it may be impractical to obtain higher memory density by simply multiplying the chip size using the same technology node. Accordingly, alternative techniques producing high-density memory are desired, particularly ones that can utilize older, less expensive memory chip technology without requiring redesign of existing computer platforms.

SUMMARY

In accordance with the invention, there is provided a method of stacking wafers, comprising: providing a first wafer including a first device structure layer and a first metal connection layer, including a first metal contact, over the first device structure layer; forming a first passivation layer over the first metal connection layer; forming a first bondpad in the first passivation layer in contact with the first metal contact to form a first bondpad layer; providing a second wafer including a second device structure layer and a second metal connection layer, including a second metal contact, over the second device structure layer; forming a second passivation layer over the second metal connection layer; forming a second bondpad in the second passivation layer in contact with the second metal contact to form a second bondpad layer; forming at least one of a first conductive adhesive layer over the first bondpad layer and a second conductive adhesive layer over the second bondpad layer; stacking the second wafer on the first wafer by bonding respective faces of the second bondpad layer with the first bondpad layer via the at least one of the first conductive adhesive layer and the second conductive adhesive layer; providing a third wafer containing a third device structure layer and a third metal connection layer, including a third metal contact, over the third device structure layer; forming a third passivation layer over the third metal connection layer; forming a third bondpad in the third passivation layer in contact with the third metal contact to form a third bondpad layer; reducing a thickness of a backside of a substrate of the second wafer subsequent to the stacking of the second wafer on the first wafer; forming an intermediate bondpad layer on the backside of the substrate of the second wafer by forming an intermediate passivation layer on the backside of the second wafer substrate, forming at least one opening in the intermediate passivation layer to a backside of the second metal contact, forming a sidewall spacer inside the at least one opening, and forming an intermediate bondpad over the backside of the second metal contact; forming at least one of an intermediate adhesive layer over the intermediate bondpad layer and a third adhesive layer over the third bondpad layer; and stacking the third wafer on the second wafer by bonding respective faces of the third bondpad layer with the intermediate bondpad layer via the at least one of the third adhesive layer and the intermediate adhesive layer.

Also in accordance with the invention, there is provided a stacked die device, comprising: a first die including a first device structure layer and a first metal connection layer, including a first metal contact, over the first device structure layer; first passivation layer over the first metal connection layer; a first bondpad in the first passivation layer in contact with the first metal contact to form a first bondpad layer; a second die including a substrate, a second device structure layer over the substrate, and a second metal connection layer, including a second metal contact, over the second device structure layer; a second passivation layer over the second metal connection layer; a second bondpad in the second passivation layer in contact with the second metal contact to form a second bondpad layer; a conductive adhesive layer between the first bondpad layer and the second bondpad layer, wherein respective faces of the first bondpad layer and the second bondpad layer are bonded via the conductive adhesive layer; an intermediate bondpad layer directly contacting a backside of the substrate of the second die, wherein the intermediate bondpad layer includes an intermediate passivation layer, at least one opening through the intermediate passivation layer and the substrate of the second die to a backside of the second metal contact, and an intermediate bondpad over the backside of the second metal contact; a third die containing a third device structure layer and a third metal connection layer, including a third metal contact, over the third device structure layer; a third passivation layer over the third metal connection layer; a third bondpad in the third passivation layer in contact with the third metal contact to form a third bondpad layer; an intermediate adhesive layer between the intermediate bondpad layer and the third bondpad layer; wherein the intermediate bondpad layer and the third bondpad layer are bonded via the intermediate adhesive layer.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated herein and constitute a part of this specification, illustrate embodiments of the invention. In the drawings.

DETAILED DESCRIPTION OF THE PREFERRED EMBODIMENTS

Figure 1A:
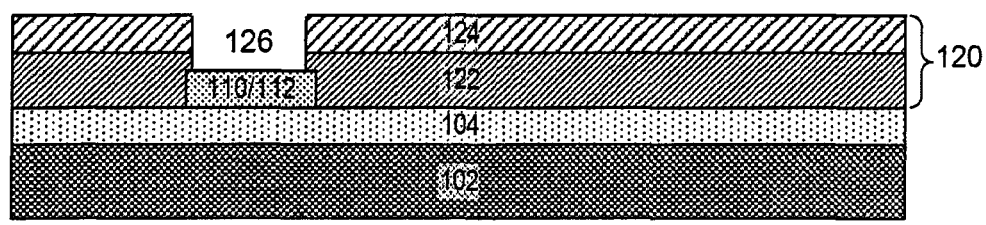
FIGS. 1a and 1b illustrate an embodiment of various processing steps performed on a semiconductor wafer.

In the following description, for purposes of explanation and not limitation, specific techniques and embodiments are set forth, such as particular sequences of steps and layouts, in order to provide a thorough understanding of the techniques presented herein. While the techniques and embodiments will primarily be described in context with the accompanying drawings, those skilled in the art will further appreciate that the techniques and embodiments can also be practiced for devices not shown in the drawings.

Reference will now be made in detail to exemplary embodiments, examples of which are illustrated in the accompanying drawings. Wherever possible, the same reference numbers will be used throughout the drawings to refer to the same or like parts.

FIG. 1a illustrates an exemplary wafer 100. Wafer 100 includes a substrate 102 and a device structure layer 104 over substrate 102. Device structure layer 104 may include an integrated circuit (IC) device structure such as a Dynamic Random Access Memory (DRAM), a flash memory, or a functional logic circuit.

A metal connection layer 110 is formed over device structure layer 104 and is configured to electrically connect to device structure layer 104. In one embodiment, metal connection layer 110 includes a metal contact 112. Metal contact 112 may be formed of aluminum, copper, or any other conductive material suitable for use. In another embodiment, metal connection layer 110 includes multiple metal contacts and laser fuses. A passivation layer 120 is subsequently formed over metal connection layer 110. Passivation layer 120 may include an oxide layer 122 and a nitride layer 124, and performs a number of functions including preventing mechanical and chemical damage to the wafer. Oxide layer 122 and nitride layer 124 may be formed by conventional techniques.

An opening 126 is formed in passivation layer 120 over metal contact 112. Opening 126 may be formed using photolithography, in which photoresist is applied over passivation layer 120, exposed through a mask, and developed. Thereafter, wafer 100 is etched, and the mask pattern is thereby transferred onto passivation layer 120, creating opening 126 in passivation layer 120 which exposes metal contact 112. Photoresist remaining on wafer 100 is stripped, and then wafer 100 is cleaned, exposing the structure depicted in FIG. 1a. In one embodiment, an opening is formed over each metal contact and each laser fuse in metal connection layer 110.

Figure 1B:
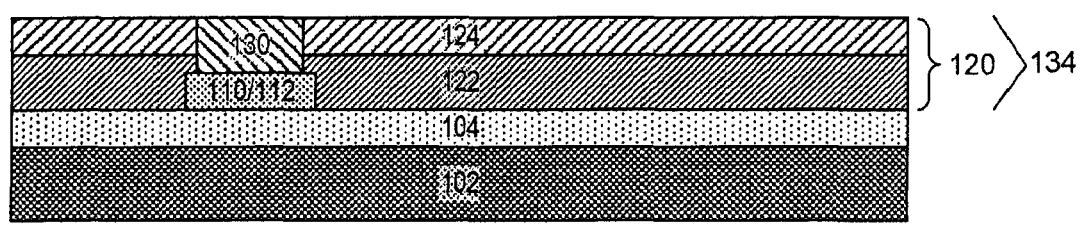

Next, in FIG. 1b, a bondpad 130 is formed in opening 126. Bondpad 130 may be formed by a variety of methods including, but not limited to, a damascene process and an electroless plating process. Bondpad 130 is formed of a conductive material, e.g., a metal such as copper. In the present embodiment, passivation layer 120 with bondpad 130 formed therein is referred to as a bondpad layer 134. Bondpad layer 134 is formed to have a substantially flat surface.

In one embodiment of bondpad formation using a single damascene process, the surface of wafer 100 is first treated in order to improve plating results. The surface treatment may include depositing a diffusion barrier (not shown), such as a Ta, TaN, or TiN layer, over passivation layer 120 and in opening 126. After surface treatment, a seed layer, such as a copper or tantalum seed layer, may be deposited by any of available methods including physical vapor deposition (PVD) and ionized metal plasma (IMP) sputtering. This seed layer conforms to the surface of passivation layer 120 and to the contour of opening 126, and promotes the growth of a subsequently deposited thicker metal layer. The thicker metal layer is deposited over the seed layer through any of available methods, such as electrolytic or electroless plating. Thereafter, an annealing step is performed in which wafer 100 is heated in order to remove impurities from the deposited thicker metal layer, and to improve the electrical properties thereof. Finally, using a chemical-mechanical polishing (CMP) process, the thicker metal layer is reduced in order to expose the surface of passivation layer 120, thereby forming bondpad 130 in opening 126, and the aforementioned flat surface of bondpad layer 134.

In one embodiment of bondpad formation using an electroless plating process, the surface of wafer 100 is first treated in order to clean, rinse, and activate the surface to be plated. Using selective electroless plating and self-aligned planarization, a layer of metal is subsequently formed in opening 126 up to the surface level of passivation layer 120, thereby forming bondpad 130. Then, an annealing step is performed. Finally, a CMP process is performed to expose and planarize the surface of passivation layer 120.

Figure 2:
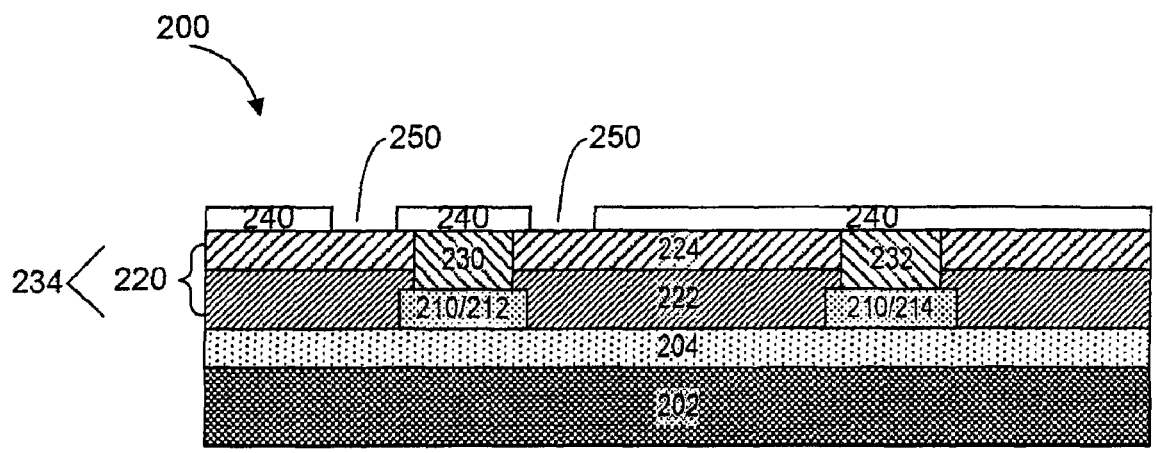
FIG. 2 illustrates an embodiment of a processing step performed on a semiconductor wafer.

FIG. 2 illustrates an exemplary wafer 200. Wafer 200 is substantially similar to wafer 100, and is formed using a method substantially similar to the method used in forming wafer 100. Wafer 200 includes a substrate 202, a device structure layer 204, a metal connection layer 210 including a first metal contact 212 and a second metal contact 214, and a passivation layer 220 including an oxide layer 222 and a nitride layer 224. Substrate 202, device structure layer 204, metal connection layer 210, passivation layer 220, oxide layer 222, and nitride layer 224 respectively correspond to substrate 102, device structure layer 104, and metal connection layer 110, passivation layer 120, oxide layer 122, and a nitride layer 124 of wafer 100. However, wafer 200 differs from wafer 100 in that metal connection layer 210 includes first metal contact 212 and second metal contact 214, whereas metal connection layer 110 in wafer 100 includes only one metal contact 112. Also, wafer 200 includes a first bondpad 230 and a second bondpad 232, whereas wafer 100 has only one bondpad 130. A bondpad layer 234 includes passivation layer 220, first bondpad 230, and second bondpad 232. In the embodiment shown in FIG. 2, metal contact 214 is a Vss contact.

For convenience of description, in accordance with terminology used herein and understood by persons of ordinary skill, each wafer consists of a plurality of dies and, upon completion of wafer processing, wafer sorting and/or laser repair, the wafer is diced into the plurality of dies, also referred to herein as chips.

A wafer sort and/or a laser fuse repair may be performed on a batch of processed wafers, including wafer 200, prior to stacking or dicing. When, for example, the wafer contains memory device structures including memory cells, in a wafer sort, each wafer is tested to determine which die (or dies) are functional or functional after repairs using pre-designed excess memory cell-string(s) on the die(s). In a laser fuse repair, fuses are strategically severed in order to isolate defective memory cell-strings in a chip. These defective memory cell-strings are then replaced with the functional excess memory cell-strings in the chip.

For purposes of illustration, an embodiment of a method of stacking wafers will be explained using a plurality of wafers each including two metal contacts. However, upon consideration of the disclosed embodiments, one of ordinary skill in the art will understand that the method of stacking wafers disclosed herein applies to wafers including one metal contact, and other embodiments of wafers including more than two metal contacts.

In FIG. 2, a conductive adhesive layer 240 is formed over bondpad layer 234. Adhesive layer 240 includes a conductive material, such as a Ti or Cu based material, e.g., including TiN, or a conductive polymer. Adhesive layer 240 is configured to include gaps 250 that provide electrical isolation between bondpads that are located on the same die, as needed, depending on desired connections or isolation between bondpads. Adhesive layer 240 may be formed and configured using any one of available methods. For example, adhesive layer 240 may be formed by depositing a layer of adhesive material, forming a mask layer having a predetermined pattern over the adhesive material layer, and dry or wet etching the adhesive material layer to form a patterned adhesive layer. Thereafter, the mask layer is removed, and a surface treatment such as sputter cleanup or wet cleaning may be performed on the patterned adhesive layer in order to prepare the patterned adhesive layer for bonding.

Since bondpad layer 234 is formed to have a substantially flat surface, adhesive layer 240 also has a substantially flat surface.

In the embodiment shown in FIG. 2, gaps 250 divide adhesive layer 240 into isolated adhesive pads of various sizes. Through the portion of adhesive layer 240 that is formed in contact with bondpad 232 over metal contact 214, metal contact 214 may be electrically connected to one or more metal contacts in wafers that are to be stacked on wafer 200, as more fully described before. However, based on the configuration of the interceding gap 250, metal contact 214 is, in the present embodiment, electrically isolated from metal contact 212. Additionally or alternatively, adhesive layer 240 can be configured to bridge two or more bondpads to electrically connect their corresponding metal contacts. Hence, adhesive layer 240 is configured to provide both isolation and connection among various bondpads, and may function as a re-routing layer. Additionally, adhesive layer 240 may act as a barrier to diffusion of metal from bondpads 230 and 232. Adhesive layer 240 may also act as a noise shield and heat sink. Gaps 250 can be small, and may have a minimum dimension of about 0.5 micron. Gaps 250 provide not only electrical isolation between bondpads, but also serve to relieve mechanical stress associated with bondpads.

Figure 3A:
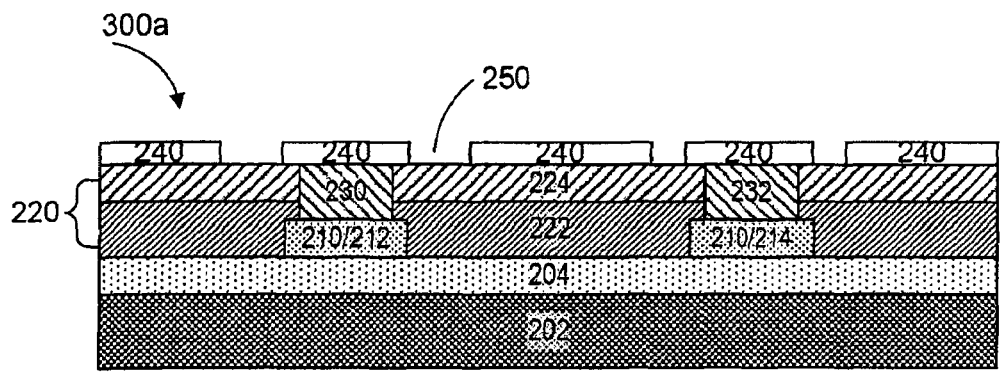
FIGS. 3a-3c illustrate various layouts of an adhesive layer over a semiconductor wafer.
Figure 3B:
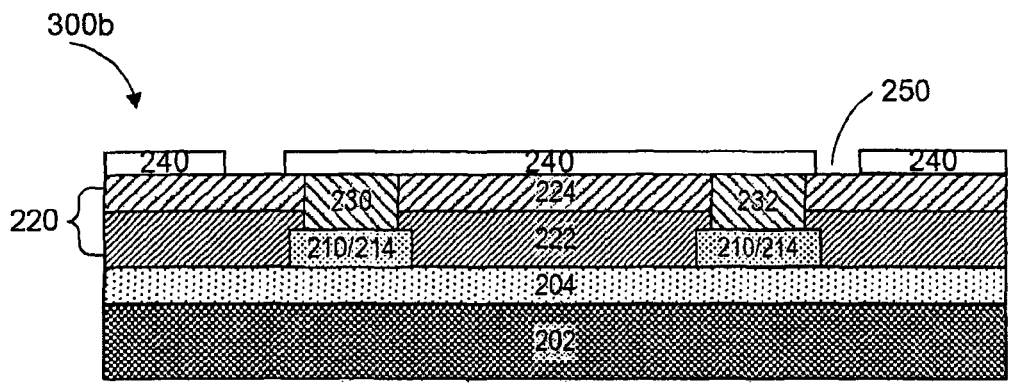
Figure 3C:
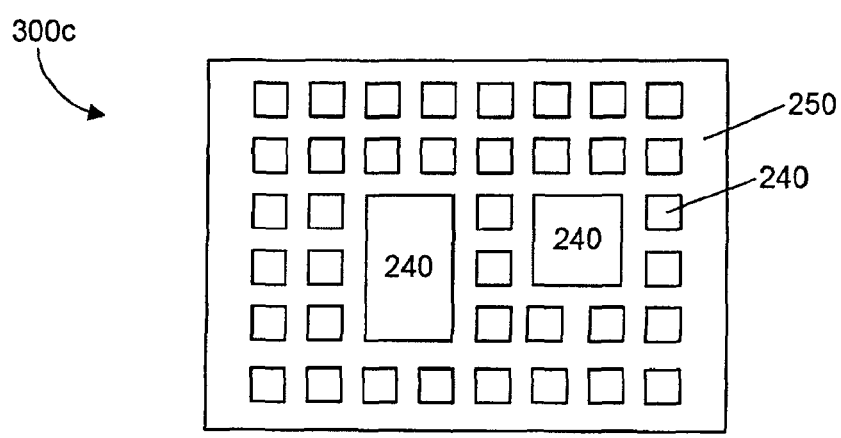

FIGS. 3a, 3b, and 3c respectively illustrate wafers 300a, 300b, and 300c that are substantially similar to wafer 200 illustrated in FIG. 2. Like wafer 200 in FIG. 2, each of wafers 300a and 300b includes substrate 202, device structure layer 204, metal connection layer 210 including first metal contact 212 and second metal contact 214, passivation layer 220 including oxide layer 222 and nitride layer 224, and first bondpad 230 and second bondpad 232 over first metal contact 212 and second metal contact 214, respectively. However, wafers 300a and 300b differ from wafer 200 in FIG. 2 in that the adhesive layer 240 of each of wafers 300a and 300b is configured with a different layout than adhesive layer 240 in FIG. 2. Also, adhesive layer 240 of wafer 300a is configured differently than adhesive layer 240 in wafer 300b.

In FIG. 3a, adhesive layer 240 of wafer 300a contains gaps 250 configured to define isolated adhesive pads, including an isolated adhesive pad over each of bondpads 230 and 232 formed over metal contacts 212 and 214, respectively. In FIG. 3b, adhesive layer 240 of wafer 300b is configured to electrically connect both Vss metal contacts 214 to each other via their respective bondpads 230 and 232 and a portion of adhesive layer 240. FIG. 3c illustrates an exemplary top view of a portion of wafer 300c on which adhesive layer 240 has been configured to contain gaps 250, creating isolated adhesive pads of various sizes. FIG. 3c illustrates that adhesive layer 240 can be configured to provide any desired electrical connections or isolation among bondpads, as well as desired connections to a wafer stacked on wafer 300c.

Figure 4:
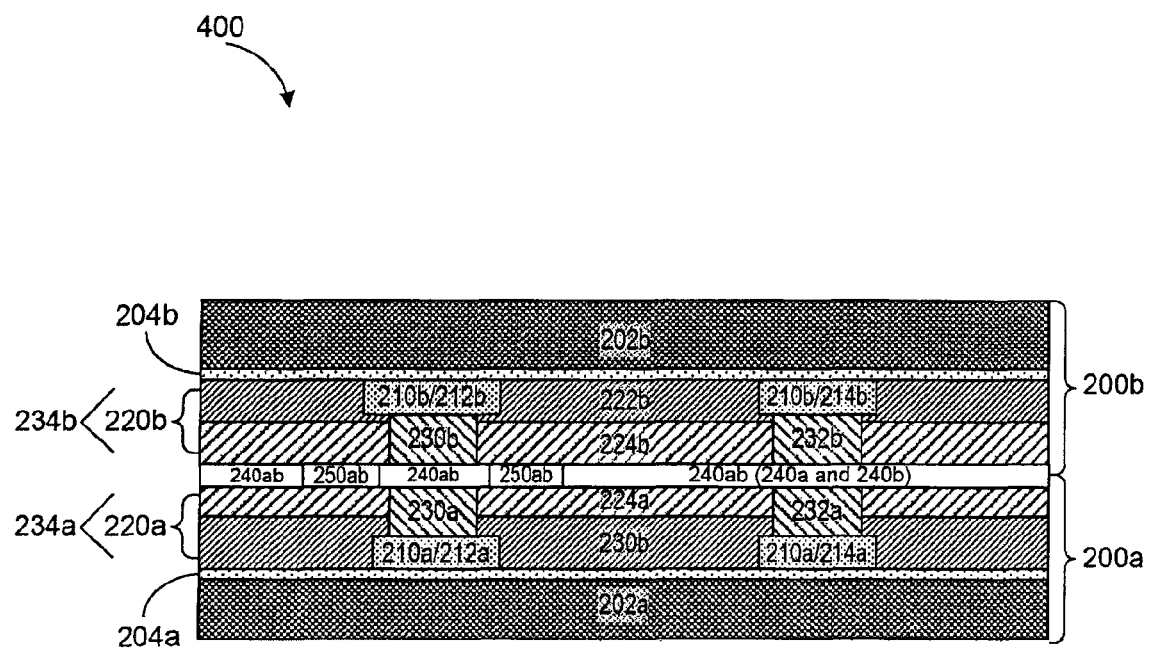
FIG. 4 illustrates an embodiment of two stacked wafers.

FIG. 4 illustrates an embodiment of a stack 400 of wafers including wafers 200a and 200b. Wafer 200a is a first exemplary wafer 200, as illustrated in FIG. 2, and wafer 200b is a second exemplary wafer 200, also as illustrated in FIG. 2. For purposes of clarity as well as brevity, each reference number used in FIG. 4 to designate a feature of wafer 200a or 200b correspond to the feature which the same reference number designates in FIG. 2. Further, in FIG. 4, suffix letter "a" or "b" is appended to each reference number to designate features of wafer 200a or 200b, respectively. For example, in FIG. 4, "202a" refers to the substrate of wafer 200a, and "202b" refers to the substrate of wafer 200b.

Thus, wafer 200a includes a substrate 202a, a device structure layer 204a, a metal connection layer 210a including a first metal contact 212a and a second metal contact 214a, a passivation layer 220a including an oxide layer 222a and a nitride layer 224a, and a first bondpad 230a and a second bondpad 232a over first metal contact 212a and second metal contact 214a, respectively. A bondpad layer 234a includes passivation layer 220a, first bondpad 230a, and second bondpad 232a. An adhesive layer 240a formed over bondpad layer 234a contains gaps 250a.

Similar to wafer 200a, wafer 200b includes a substrate 202b, a device structure layer 204b, a metal connection layer 210b including a first metal contact 212b and a second metal contact 214b, a passivation layer 220b including an oxide layer 222b and a nitride layer 224b, and a first bondpad 230b and a second bondpad 232b over first metal contact 212b and second metal contact 214b, respectively. A bondpad layer 234b includes passivation layer 220b, first bondpad 230b, and second bondpad 232b. Optionally, an adhesive layer 240b is formed over bondpad layer 234b and contains gaps 250b. Alternatively, only one of adhesive layers 240a and 240b may be provided, e.g., adhesive layer 240a is formed while adhesive layer 240b is omitted.

Wafer 200a and 200b are stacked by directly bonding their respective faces of bondpad layers 234a and 234b via adhesive layers 240a and 240b if both are provided, or only via adhesive layer 240a if adhesive layer 240b is omitted. If both adhesive layers 240a and 240b are provided, then bonding of bondpad layers 234a and 234b is effected via a combined adhesive layer 240ab and combined gaps 250ab, as shown in FIG. 4. If only adhesive layer 240a is provided while adhesive layer 240b is omitted, then bonding of bondpad layers 234a and 234b is effective via adhesive layer 240a. Further, as noted above, since bondpad layers 234a and 234b are formed to be substantially flat, so that adhesive layers 240a and 240b are also respectively substantially flat, the faces of bondpad layers 234a and 234b being bonded to each other via adhesive layers 240a and 240b or only adhesive layer 240a, are substantially flat.

The resulting stack 400 includes wafer 200b stacked on wafer 200a, where wafer 200b is oriented in an up-side down manner with respect to wafer 200a. One of ordinary skill in the art will now appreciate that wafer 200a should be configured in such a way as to permit desired connections between wafer 200a and wafer 200b when wafer 200b is oriented in an up-side down manner with respect to wafer 200a.

Because adhesive layers 240a and 240b are configured to have smooth surfaces, a reliable contact is achieved between wafers 200a and 200b. Alignment marks (not shown) may be formed on wafers 200a and 200b prior to bonding in order to aid in positioning and aligning the wafers during the stacking process. The alignment marks may be formed on either face of each wafer, or on a wafer edge.

In stack 400, wafers 200a and 200b are aligned so that metal contact 212a is electrically connected to metal contact 212b through bondpad 230a, combined adhesive layer 240ab (240a and 240b), and bondpad 230b. Similarly, metal contact 214a is electrically connected to metal contact 214b through bondpad 232a, combined adhesive layer 240ab, and bondpad 232b. On the other hand, metal contact 212a is electrically isolated from metal contacts 214a and 214b because of intervening combined gaps 250ab.

Figure 5:
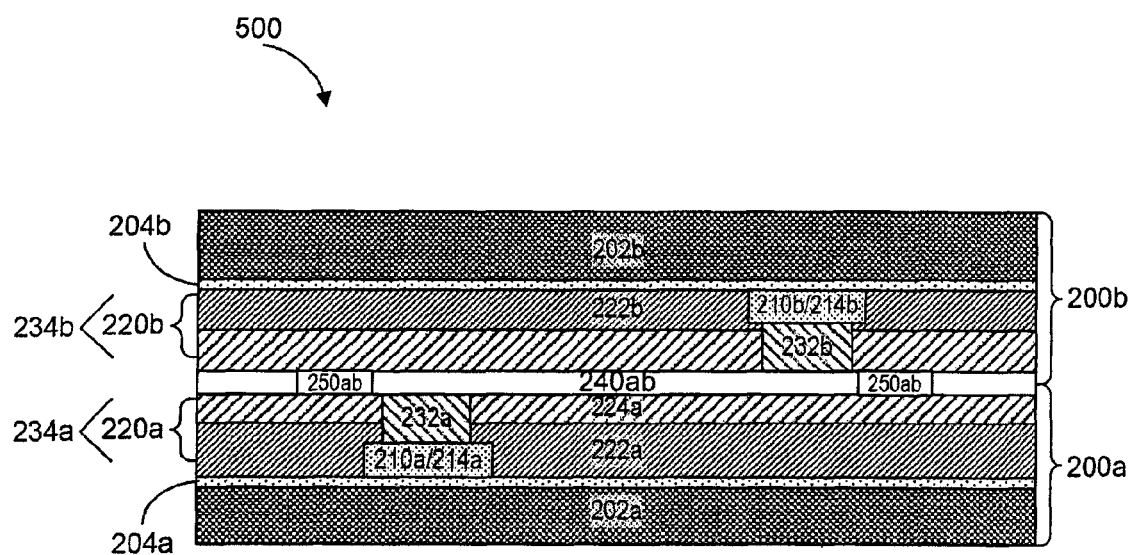
FIG. 5 illustrates another embodiment of two stacked wafers.

FIG. 5 illustrates an embodiment of a stack 500 including two stacked wafers 200a and 200b. FIG. 5 differs from FIG. 4 in that stack 500 shown in FIG. 5 illustrates only one metal contact, i.e., metal contact 214a or 214b, and one bondpad, i.e., bondpad 232a or 232b, in each wafer, whereas stack 400 in FIG. 4 illustrates two metal contacts and two bondpads in each wafer. Aside from the number of metal contacts and bondpads in each wafer, wafers 200a and 200b are substantially similar to wafers 200a and 200b shown in FIG. 4.

Wafers 200a and 200b in FIG. 5 are stacked in a manner substantially similar to the stacking of wafers 200a and 200b in FIG. 4, that is, by directly bonding respective faces of adhesive layers 240a and 240b, resulting in a combined adhesive layer 240ab and combined gaps 250ab. Stack 500 differs from stack 400 in that metal contacts 214a and 214b of wafers 200a and 200b, respectively, are not vertically aligned. Nevertheless, metal contacts 214a and 214b electrically connect to each other through bondpad 232a, combined adhesive layer 240ab, and bondpad 232b. Thus, FIG. 5 illustrates the function of adhesive layer 240 to make electrical connection between non-aligned bondpads of stacked wafers.

Figure 6A:
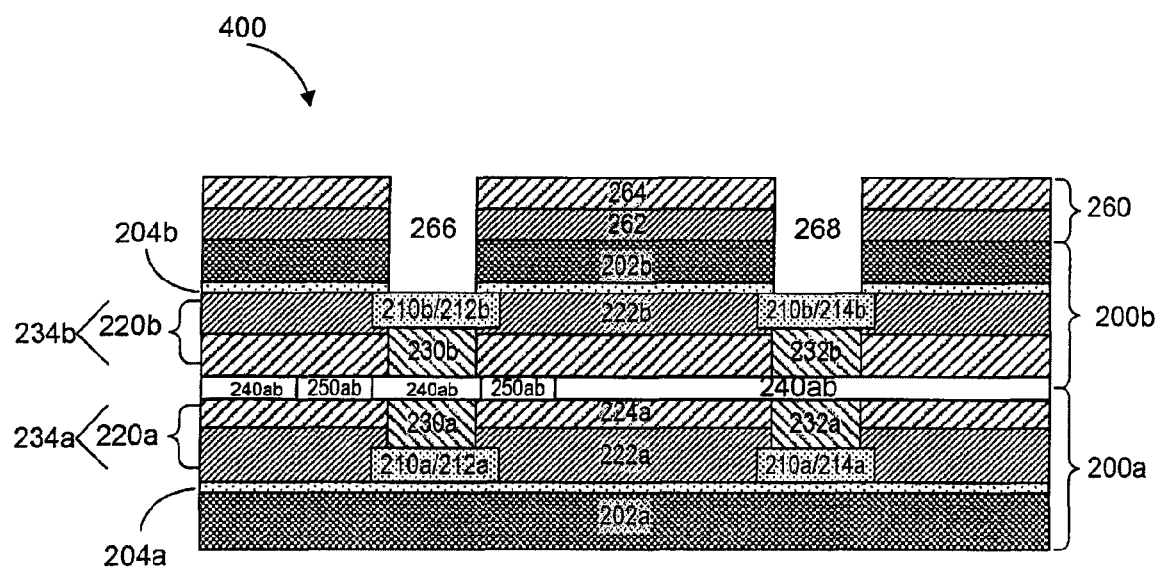
FIGS. 6a-6c illustrate an embodiment of various processing steps subsequent to stacking two wafers.
Figure 6B:
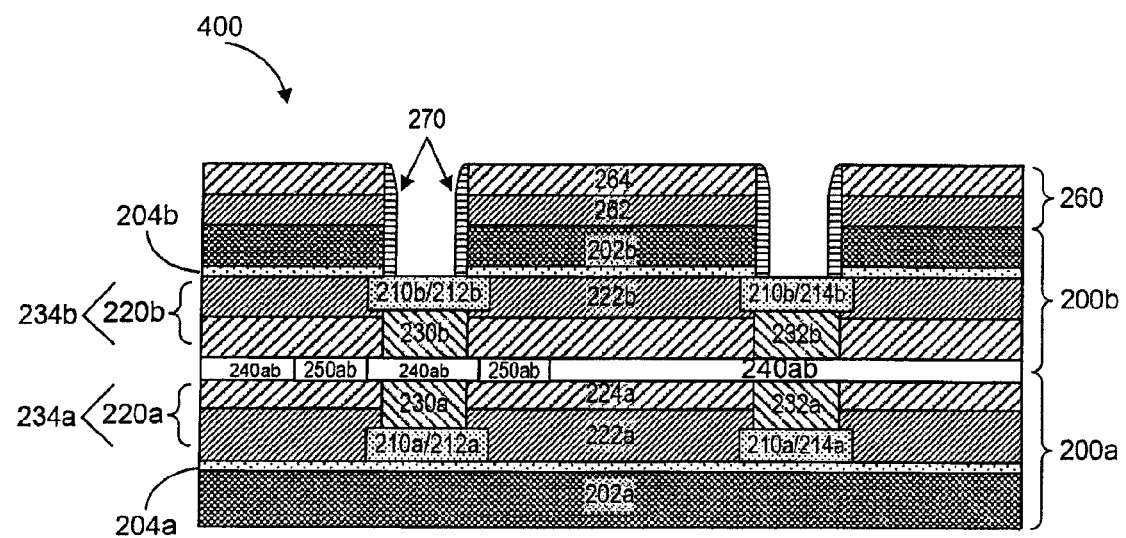
Figure 6C:
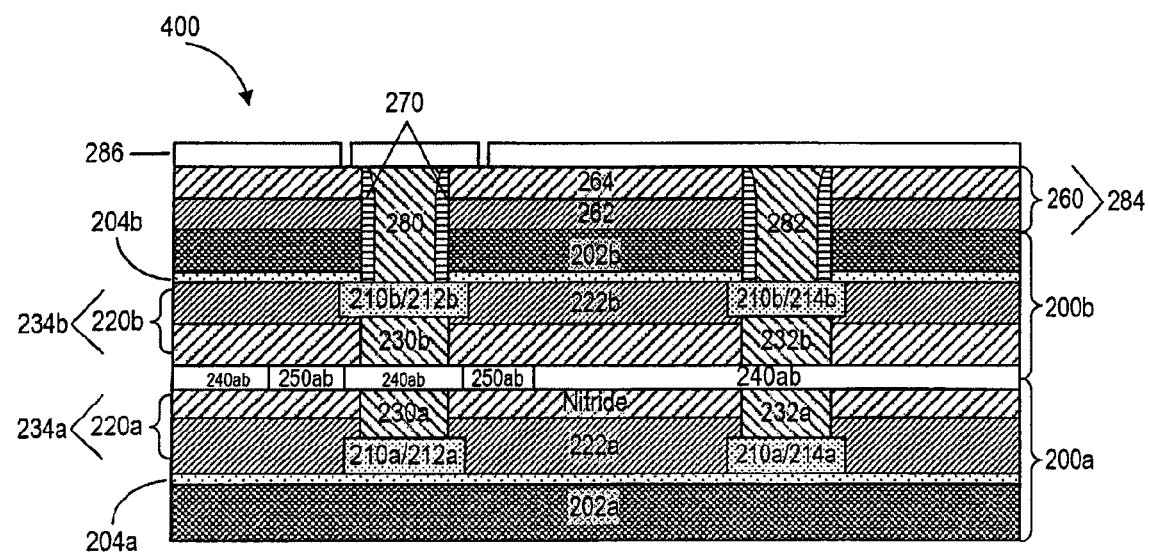

FIGS. 6a-6c illustrate further steps in the wafer stacking process consistent with embodiments of the invention, carried out using stack 400 as an example. First, in FIG. 6a, the thickness of a backside of substrate 202b is reduced to a target thickness using any of available chemical and/or mechanical methods, e.g., sand blasting. In one embodiment, the thickness of the backside of substrate 202b is reduced to 10 microns or less. Following the thickness reduction, a CMP step may be performed in order to more accurately achieve the targeted thickness. The CMP step may also create a planarized, i.e., flat, surface on the backside of substrate 202b in order to facilitate further processing.

Next, a passivation layer 260 is formed over substrate 202b. Passivation layer 260 may include an oxide layer 262 and a nitride layer 264 formed by conventional techniques. Openings 266 and 268 are subsequently formed in passivation layer 260 and substrate 202b to expose backsides of metal contacts 212b and 214b. Openings 266 and 268 may be formed using the same techniques described with respect to the formation of opening 126 in FIG. 1a.

Next, as illustrated in FIG. 6b, sidewall spacers 270 are formed on the vertical walls of each of openings 266 and 268 through steps of deposition and etch back. Sidewall spacers 270 may comprise an oxide, and serve to isolate substrate 202b from bondpads that will be formed in openings 266 and 268. Then, as illustrated in FIG. 6c, bondpads 280 and 282 are formed inside openings 266 and 268, respectively. Bondpads 280 and 282 may be formed using methods previously described for forming bondpad 130 in FIG. 1b. Formation of bondpads 280 and 282 completes the formation of an intermediate bondpad layer 284 including passivation layer 260, sidewall spacers 270, and bondpads 280 and 282. Finally, an intermediate adhesive layer 286 may be formed over bondpad layer 284 using the method previously described to form adhesive layer 240 in FIG. 2. Intermediate adhesive layer 286 may be suitably configured with gaps to facilitate isolation or conductive connection between bondpads, e.g., bondpads 280 and 282, of bondpad layer 284 and/or with bondpads of another wafer stacked on wafer 200b. After intermediate adhesive layer 286 is formed, stack 400 is ready for the stacking of another wafer thereon.

Figure 7:
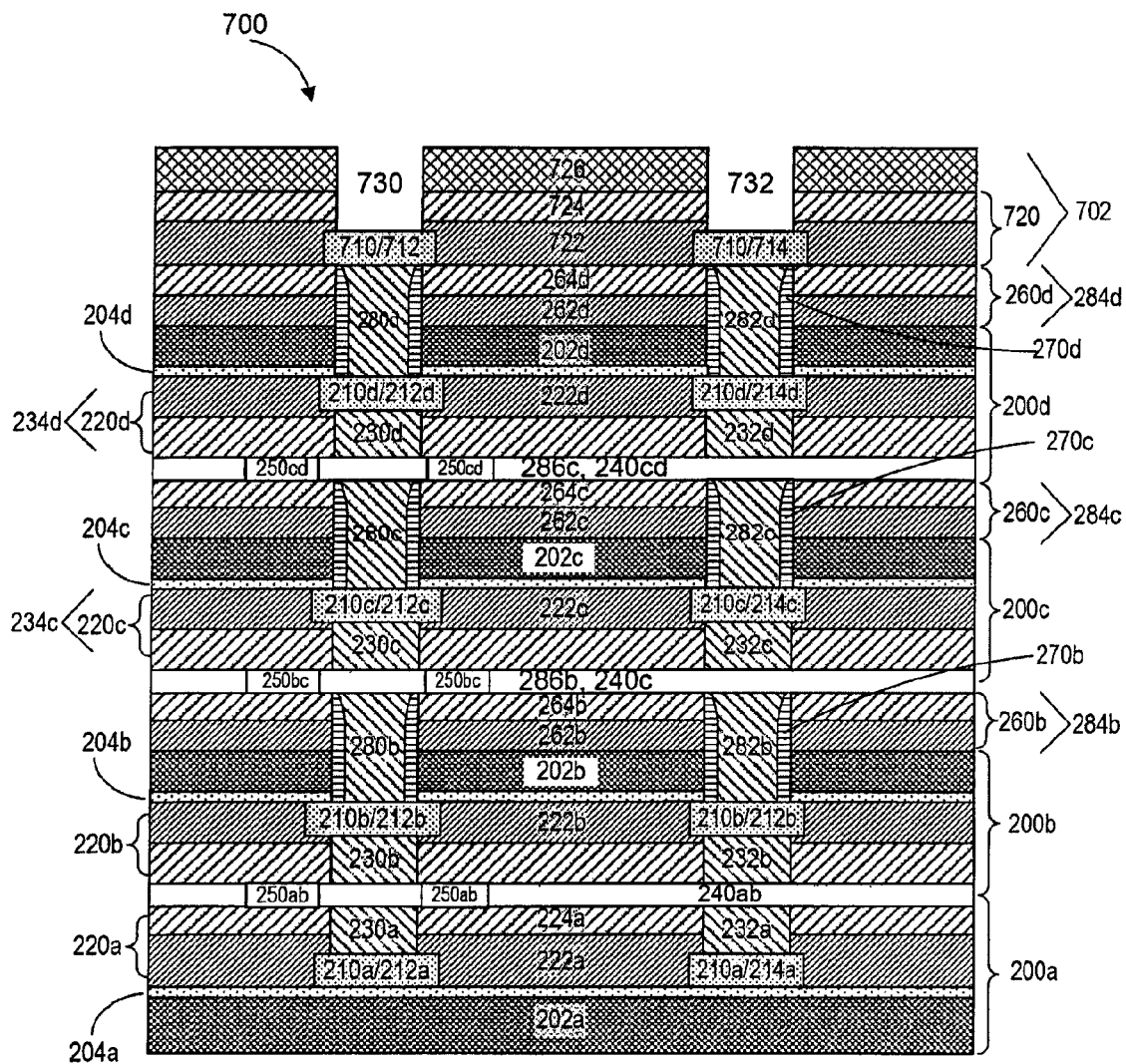
FIG. 7 illustrates an embodiment of four stacked wafers.

Using the same method previously described in association with the stacking of wafer 200b onto wafer 200a in FIGS. 4-6c, additional wafers may be stacked. FIG. 7 illustrates an exemplary stack 700, including wafers 200a, 200b, 200c, and 200d. The stacking of wafers 200a and 200b was previously discussed in association with FIGS. 4-6c. In FIG. 7, an intermediate bondpad layer 284b corresponds to intermediate bondpad layer 284 described in FIG. 6c, and includes a passivation layer 260b including an oxide layer 262b and a nitride layer 264b, sidewall spacers 270b, and bondpads 280b and 282b. Intermediate bondpad layer 284b is formed on the backside of wafer 200b, which is stacked over wafer 200a. An intermediate adhesive layer 286b corresponds to intermediate adhesive layer 286 in FIG. 6c, and is formed over intermediate bondpad layer 284b. Additionally, FIG. 7 includes a wafer 200c and a wafer 200d, the features of which have appended thereto the suffix letters "c" and "d," respectively.

Wafer 200c includes a substrate 202c, a device structure layer 204c, a metal connection layer 210c including a first metal contact 212c and a second metal contact 214c, a passivation layer 220c including an oxide layer 222c and a nitride layer 224c, and a first bondpad 230c and a second bondpad 232c over first metal contact 212c and second metal contact 214c, respectively. A bondpad layer 234c includes passivation layer 220c, first bondpad 230c, and second bondpad 232c. An adhesive layer 240c formed over bondpad layer 234c contains gaps 250c. Similarly, wafer 200d includes a substrate 202d, a device structure layer 204d, a metal connection layer 210d including a first metal contact 212d and a second metal contact 214d, a passivation layer 220d including an oxide layer 222d and a nitride layer 224d, and a first bondpad 230d and a second bondpad 232d over first metal contact 212d and second metal contact 214d, respectively. A bondpad layer 234d includes passivation layer 220d, first bondpad 230d, and second bondpad 232d. An adhesive layer 240d formed over bondpad layer 234d contains gaps 250d.

Wafer 200c is stacked over wafer 200b, and wafer 200d is stacked over wafer 200c. The method of stacking wafer 200c over wafer 200b and wafer 200d over wafer 200c is substantially similar to the method previously described in association with the stacking of wafer 200b onto wafer 200a. Prior to stacking wafer 200d, an intermediate bondpad layer 284c is formed on the backside of wafer 200c, and includes a passivation layer 260c including an oxide layer 262c and a nitride layer 264c, sidewall spacers 270c, and first and second bondpads 280c and 282c. An intermediate adhesive layer 286c is formed over intermediate bondpad layer 284c. Intermediate adhesive layer 286c may be suitably configured with gaps to facilitate isolation or conductive connection between bondpads, e.g., bondpads 280c and 282c, of bondpad layer 284c and/or with bondpads of wafer 200d.

Also, an intermediate bondpad layer 284d is formed on the backside of wafer 200d, and includes a passivation layer 260d including an oxide layer 262d and a nitride layer 264d, sidewall spacers 270d, and first and second bondpads 280d and 282d. In one embodiment, after the last wafer 200d is stacked and a thickness of the backside of substrate 202d is reduced, alignment marks previously formed on the backside of substrate 202d may be removed.

In reducing the thicknesses of the backsides of substrates 202b, 202c, and 202d, the substrates are polished to ensure that their surfaces are flat. That is, each surface not connected via an adhesive layer, i.e., the interfaces between wafers 200b, 200c, and 200d, and passivation layers 260b, 260c, and 260d, respectively, is flat. Accordingly, except for the top and bottom surfaces of stack 700, each wafer within the stack has a flat surface. In accordance with one embodiment of the invention, after all substrate thickness reductions are completed, substrate 202a is thicker than substrates 202b, 202c, 202d, and 202e.

After stacking the last wafer 200d, a final layer 702 is formed over intermediate bondpad layer 284d, which is formed on the backside of wafer 200d. Final layer 702 includes a final metal connection layer 710 formed over final intermediate bondpad layer 284d. Final metal connection layer 710 includes a metal contact 712 over and in contact with bondpad 280d, and a metal contact 714 over and in contact with bondpad 282d. Final layer 702 also includes a final passivation layer 720 formed over final metal connection layer 710. Final passivation layer 720 may include an oxide layer 722 and a nitride layer 724. Final layer 702 further includes a polyimide layer 726 formed over final passivation layer 720. Polyimide layer 726 may act as a protective layer.

ferent IC devices at a low cost. Because the adhesive layers between stacked wafers are formed in a precise manner such that the stacked wafers electrically connect to each other in a predetermined manner, vertically aligned dies within the stacked wafers may work together as one unit. When each wafer in the stack of wafers contains memory device structures, a high density memory structure composed of vertically aligned dies is formed at a low cost by stacking wafers containing low density memory structures that, optionally, may all contain the same memory capacity device structures. Moreover, contacts on each die within each wafer provide functional access to the memory device formed within the die. As a result, when the wafers are stacked and vertically aligned dies are conductively coupled via the adhesive layers, functional access is provided to the memory devices of the respective vertically aligned dies.

Table 1 below shows the wafer sort result of a wafer probe test performed on a stacked wafer structure of four wafers, the dies of each wafer each containing a 1 Gb DRAM structure. The stack of four wafers thus includes numerous vertically aligned stacks of dies, each aligned stack of dies forming a stacked DRAM structure. In Table 1, for illustrative purposes, it is assumed that a probe test determines that 80% of dies on each wafer are functional ("good die") and 20% of die on each wafer are defective ("bad die"). Accordingly, the stack of four wafers, each containing 1 Gb DRAM structures, offers a collection of 4 Gb capacity yields, when all four stacked dies are

TABLE 1

Accumulative Wafer Sorting Yield of Stacked 4 Dies

| Sorting | 1st WF | 2nd WF | 3rd WF | 4th WF | 4 Gb Yield | 3 Gb Yield | 2 Gb Yield | 1 Gb Yield | Bad Die |
|---------|--------|--------|--------|--------|------------|------------|------------|------------|---------|
| good die | 80% | 80% | 80% | 80% | 40.96% | | | | |
| | | | | 20% | | 10.24% | | | |
| | | | 20% | 80% | | 10.24% | | | |
| | | | | 20% | | | 2.56% | | |
| | | 20% | 80% | 80% | | 10.24% | | | |
| | | | | 20% | | | 2.56% | | |
| | | | 20% | 80% | | | 2.56% | | |
| | | | | 20% | | | | 0.64% | |
| bad die | 20% | 80% | 80% | 80% | | 10.24% | | | |
| | | | | 20% | | | 2.56% | | |
| | | | 20% | 80% | | | 2.56% | | |
| | | | | 20% | | | | 0.64% | |
| | | 20% | 80% | 80% | | | 2.56% | | |
| | | | | 20% | | | | 0.64% | |
| | | | 20% | 80% | | | | 0.64% | |
| | | | | 20% | | | | | 0.16% |
| | | sub-total | | | 40.96% | 40.96% | 15.36% | 2.56% | 0.16% |
| | | TOTAL | | | | | 99.84% | | |

Openings 730 and 732 are formed through polyimide layer 726 and final passivation layer 720 to expose metal contacts 712 and 714. Openings 730 and 732 may be formed using the method previously described to form opening 126 in FIG. 1a. Finally, additional bondpads may be formed in openings 730 and 732 (not shown).

Embodiments of the wafer stacking process presented above may be applied to all types of semiconductor wafers and IC devices including, for example, DRAM and flash memory, and devices with application-specific integrated circuits (ASICs), to form systems on chips (SoC). As previously described, these devices are formed in the device structure layer in each wafer. These embodiments provide a simple and efficient process of stacking multiple wafers supporting different good dies; 3 Gb capacity yields, when three of the stacked dies are good dies; 2 Gb capacity yields, when two of the stacked dies are good dies; and 1 Gb capacity yields, when one of the stacked dies is a good die. Table 1 shows that when 80% of dies on each wafer are good dies and 20% are bad dies, 40.96% of all dies in the stacked wafer structure contain good 4 Gb DRAMs, 40.96% contain good 3 Gb DRAMs, 15.36% contain good 2 Gb DRAMs, and 2.56% contain good 1 Gb DRAMs. That is, 99.84% all dies in the stacked wafer structure contain good DRAMs of a certain capacity.

Table 2 below shows the backend yield of packages formed from four stacked wafers each containing 1Gb DRAM structures. Because the sizes of dies are substantially the same, packages respectively containing 4 Gb, 3 Gb, 2 Gb, and 1 Gb

TABLE 2

Backend Yield for 4 WF Bonding Stack

| 4WF Stack Bonding Yield | Assembly Yield | BE Test Yield | | | | 4 Gb Package Yield | | | | | 3 Gb Package Yield | | | |
|---|---|---|---|---|---|---|---|---|---|---|---|---|---|---|
| | | 1st WF | 2nd WF | 3rd WF | 4th WF | 4 Gb | 3 Gb | 2 Gb | 1 Gb | Bad Die | 3 Gb | 2 Gb | 1 Gb | Bad Die |
| 96% | 99% | 90% | 90% | 90% | 90% | 65.61% | | | | | 72.90% | | | |
| | | | | | 10% | | 7.29% | | | | | | | |
| | | | | 10% | 90% | | 7.29% | | | | | | | |
| | | | | | 10% | | | 0.81% | | | | 8.10% | | |
| | | | 10% | 90% | 90% | | 7.29% | | | | | | | |
| | | | | | 10% | | | 0.81% | | | | 8.10% | | |
| | | | | 10% | 90% | | | 0.81% | | | | | | |
| | | | | | 10% | | | | 0.09% | | | | 0.90% | |
| | | 10% | 90% | 90% | 90% | | 7.29% | | | | | | | |
| | | | | | 10% | | | 0.81% | | | | 8.10% | | |
| | | | | 10% | 90% | | | 0.81% | | | | | | |
| | | | | | 10% | | | | 0.09% | | | | 0.90% | |
| | | | 10% | 90% | 90% | | | 0.81% | | | | | | |
| | | | | | 10% | | | | 0.09% | | | | 0.90% | |
| | | | | 10% | 90% | | | | 0.09% | | | | | |
| | | | | | 10% | | | | | 0.01% | | | | 0.10% |
| | | Sun total | | | | 65.61% | 29.16% | 4.86% | 0.36% | 0.01% | 72.90% | 24.30% | 2.70% | 0.10% |
| 96% | 99% | 90% | 90% | 90% | 90% | 65.61% | | | | 34.39% | 69.28% | 23.09% | 2.57% | 5.06% |
| TOTAL BE Yield for non-compatible package among 1 Gb/2 Gb/3 Gb/4 Gb | | | | | | 62.36% | | | | | 65.85% | | | |
| TOTAL Backend Yield for compatible package among 1 Gb/2 Gb/3 Gb/4 Gb | | | | | | 95.03% | | | | | 90.23% | | | |
| WS Sorting Yield of Stacked 4 Gb DRAM | | | | | | 40.96% | | | | | 40.96% | | | |
| Accumulative Yield on Different Densities | | | | | | 38.92% | | | | | 35.96% | | | |
| Normalized Accumulative Yield on All Densities | | | | | | 91.91% (Accumulative 1 Gb yield without stacking: 80% WS *99% Assembly *90% BE = 71.28%) | | | | | | | | |

| 4WF Stack Bonding Yield | Assembly Yield | BE Test Yield | | | | 2 Gb Package Yield | | | 1 Gb Package Yield | |
|---|---|---|---|---|---|---|---|---|---|---|
| | | 1st WF | 2nd WF | 3rd WF | 4th WF | 2 Gb | 1 Gb | Bad Die | 1 Gb | Bad Die |
| 96% | 99% | 90% | 90% | 90% | 90% | 81.00% | | | 98.00% | |
| | | | | | 10% | | | | | |
| | | | | 10% | 90% | | | | | |
| | | | | | 10% | | | | | |
| | | | 10% | 90% | 90% | | | | | |
| | | | | | 10% | | | | | |
| | | | | 10% | 90% | | | | | |
| | | | | | 10% | | 9.00% | | | |
| | | 10% | 90% | 90% | 90% | | | | | |
| | | | | | 10% | | | | | |
| | | | | 10% | 90% | | | | | |
| | | | | | 10% | | 9.00% | | | |
| | | | 10% | 90% | 90% | | | | | |
| | | | | | 10% | | | | | |
| | | | | 10% | 90% | | | | | |
| | | | | | 10% | | | 1.00% | | 2.00% |
| | | Sun total | | | | 81.00% | 18.00% | 1.00% | 98.00% | 2.00% |
| | 96% | 99% | 90% | 90% | 90% | 90% | 76.98% | 17.11% | 5.91% | 93.14% | 6.86% |
| TOTAL BE Yield for non-compatible package among 1 Gb/2 Gb/3 Gb/4 Gb | | | | | | 76.98% | | | 93.14% | |
| TOTAL Backend Yield for compatible package among 1 Gb/2 Gb/3 Gb/4 Gb | | | | | | 89.42% | | | 89.47% | |
| WS Sorting Yield of Stacked 4 Gb DRAM | | | | | | 15.36% | | | 2.56% | |
| Accumulative Yield on Different Densities | | | | | | 13.74% | | | 2.29% | |
| Normalized Accumulative Yield on All Densities | | | | | | 91.91% (Accumulative 1 Gb yield without stacking: 80% WS *99% Assembly *90% BE = 71.28%) | | | | |

DRAM structures are all compatible with each other. Moreover, packages including multiple structures may be redefined to be any density that is a multiple of the unit chip density, such as 1 Gb, 2 Gb, 3 Gb, and 4 Gb, etc. This may be achieved by means of retaining or severing interconnections among the bonded chips by selecting opening fused connections that are designed into each unit chip. Accordingly, the stacked memory of 4 Gb provides four different product choices. It is assumed that the wafer bonding yield is 96%, the assembly yield is 99%, and the backend test yield is 90%. As Table 2 shows, the total backend yield for functional packages is 95.03%. Taking into account the 80% yield of good dies after wafer sorting, the accumulative yield is 91.91%. This percentage is 20.63% higher than the accumulative yield of 1 Gb memory packages without stacking.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A method of stacking wafers, comprising:
   providing a first wafer including a first device structure layer and a first metal connection layer, including a first metal contact, over the first device structure layer;
   forming a first passivation layer over the first metal connection layer;
   forming a first bondpad in the first passivation layer in contact with the first metal contact to form a first bondpad layer;
   providing a second wafer including a second device structure layer and a second metal connection layer, including a second metal contact, over the second device structure layer;
   forming a second passivation layer over the second metal connection layer;
   forming a second bondpad in the second passivation layer in contact with the second metal contact to form a second bondpad layer;
   forming at least one of a first conductive adhesive layer over the first bondpad layer and a second conductive adhesive layer over the second bondpad layer;
   stacking the second wafer on the first wafer by bonding respective faces of the second bondpad layer with the first bondpad layer via the at least one of the first conductive adhesive layer and the second conductive adhesive layer;
   providing a third wafer containing a third device structure layer and a third metal connection layer, including a third metal contact, over the third device structure layer;
   forming a third passivation layer over the third metal connection layer;
   forming a third bondpad in the third passivation layer in contact with the third metal contact to form a third bondpad layer;
   reducing a thickness of a backside of a substrate of the second wafer subsequent to the stacking of the second wafer on the first wafer;
   forming an intermediate bondpad layer on the backside of the substrate of the second wafer by
      forming an intermediate passivation layer on the backside of the second wafer substrate,
      forming at least one opening in the intermediate passivation layer to a backside of the second metal contact,
      forming a sidewall spacer inside the at least one opening, and
      forming an intermediate bondpad over the backside of the second metal contact;
   forming at least one of an intermediate adhesive layer over the intermediate bondpad layer and a third adhesive layer over the third bondpad layer; and
   stacking the third wafer on the second wafer by bonding respective faces of the third bondpad layer with the intermediate bondpad layer via the at least one of the third adhesive layer and the intermediate adhesive layer.

2. The method of stacking wafers of claim 1, wherein forming the first bondpad layer includes:
   forming a first opening in the first passivation layer to expose the first metal contact; and
   forming the first bondpad in the first opening.

3. The method of stacking wafers of claim 2, wherein forming the second bondpad layer includes:
   forming a second opening in the second passivation layer to expose the second metal contact; and
   forming the second bondpad in the second opening.

4. The method of stacking wafers of claim 2, wherein the first metal connection layer includes a fourth metal contact, and wherein forming the first bondpad layer further includes:
   forming a second opening in the first passivation layer to expose the fourth metal contact; and
   forming a fourth bondpad in the second opening.

5. The method of stacking wafers of claim 4, wherein forming the at least one of the first and the second conductive adhesive layers includes forming the at least one of the first and the second conductive adhesive layers to contact both the first and fourth bondpads to thereby conductively connect the first and fourth bondpads.

6. The method of stacking wafers of claim 4, wherein forming the at least one of the first and the second conductive adhesive layers includes forming the at least one of the first and the second conductive adhesive layers to include a gap between the first and fourth bondpads to thereby electrically isolate the first bondpad from the fourth bondpad.

7. The method of stacking wafers of claim 4, further comprising forming the at least one of the first and the second conductive adhesive layers to provide electrical connection between the first bondpad and the second bondpad, and electrical isolation between the first bondpad and the fourth bondpad.

8. The method of stacking wafers of claim 1, further comprising forming the first and the second bondpad layers to each have a substantially flat surface.

9. The method of stacking wafers of claim 1, further comprising forming the at least one of the first and the second conductive adhesive layers to provide electrical connection between the first bondpad and the second bondpad.

10. The method of stacking wafers of claim 1, wherein forming the first adhesive layer includes:
    depositing a layer of adhesive material over the first bondpad layer;
    forming a mask layer having a predetermined pattern over the adhesive material layer;
    etching the adhesive material layer to form a patterned adhesive layer;
    removing the mask layer; and
    performing a sputter clean or a wet clean process on the patterned adhesive layer.

11. The method of stacking wafers of claim 1, further comprising:
    forming a final intermediate bondpad layer on a backside of a substrate of a final wafer subsequent to stacking the final wafer;
    forming a final metal connection layer over the final bondpad layer;
    forming a final passivation layer over the final metal connection layer;
    forming a polyimide layer over the final passivation layer; and forming at least one opening in the final passivation layer to expose the final metal connection layer.

12. The method of stacking wafers of claim 1, further comprising forming alignment marks on each of the first, second, and third wafers prior to stacking.

13. The method of stacking wafers of claim 1, wherein forming the intermediate bondpad layer further includes:
   forming the intermediate passivation layer to include an oxide layer and a nitride layer;
   depositing and etching an oxide to create the sidewall spacer;
   plating the at least one opening with a metal; and
   chemical-mechanical polishing the metal to form the intermediate bondpad.

14. The method of stacking wafers of claim 1, further comprising performing a wafer sort on a plurality of wafers prior to stacking, wherein the first wafer and the second wafer are selected from the plurality of wafers.

15. The method of stacking wafers of claim 1, further comprising forming the at least one of the first and second conductive adhesive layers to provide at least one of a diffusion barrier, noise shield, and heat sink.

16. The method of stacking wafers of claim 1, wherein forming the at least one of the first and second conductive adhesive layer includes lithography, etching, mask removal, and surface treatment.

17. The method of stacking wafers of claim 1, further comprising forming the at least one of the first and second conductive adhesive layers using a Ti-based material.

18. The method of stacking wafers of claim 1, further comprising forming the at least one of the first and second conductive adhesive layers to include gaps which provide electrical isolation.

19. The method of stacking wafers of claim 1, further comprising forming the first and the second bondpad layers substantially free of vias or holes in the surface of the bondpad layers.

20. A stacked die device, comprising:
   a first die including a first device structure layer and a first metal connection layer, including a first metal contact, over the first device structure layer;
   a first passivation layer over the first metal connection layer;
   a first bondpad in the first passivation layer in contact with the first metal contact to form a first bondpad layer;
   a second die including a substrate, a second device structure layer over the substrate, and a second metal connection layer, including a second metal contact, over the second device structure layer;
   a second passivation layer over the second metal connection layer;
   a second bondpad in the second passivation layer in contact with the second metal contact to form a second bondpad layer;
   a conductive adhesive layer between the first bondpad layer and the second bondpad layer, wherein respective faces of the first bondpad layer and the second bondpad layer are bonded via the conductive adhesive layer;
   an intermediate bondpad layer directly contacting a backside of the substrate of the second die, wherein the intermediate bondpad layer includes an intermediate passivation layer, at least one opening through the intermediate passivation layer and the substrate of the second die to a backside of the second metal contact, and an intermediate bondpad over the backside of the second metal contact;
   a third die containing a third device structure layer and a third metal connection layer, including a third metal contact, over the third device structure layer;
   a third passivation layer over the third metal connection layer;
   a third bondpad in the third passivation layer in contact with the third metal contact to form a third bondpad layer;
   an intermediate adhesive layer between the intermediate bondpad layer and the third bondpad layer;
   wherein the intermediate bondpad layer and the third bondpad layer are bonded via the intermediate adhesive layer.

21. The stacked die device of claim 20, wherein the thickness of a substrate of the first die is thicker than the substrate of the second die and a substrate of the third die.

22. The stacked die device of claim 20, further comprising a fourth bondpad in the first passivation layer, wherein the conductive adhesive layer provides electrical connection between the first bondpad and the second bondpad, and electrical isolation between the first bondpad and the fourth bondpad.

* * * * *